United States Patent
Fukuchi et al.

(10) Patent No.: US 12,131,964 B2
(45) Date of Patent: *Oct. 29, 2024

(54) PLASMA PROCESSING APPARATUS AND PLASMA PROCESSING METHOD

(71) Applicant: Hitachi High-Tech Corporation, Tokyo (JP)

(72) Inventors: Kousuke Fukuchi, Tokyo (JP); Ryoji Asakura, Hillsboro, OR (US); Soichiro Eto, Tokyo (JP); Tsubasa Okamoto, Tokyo (JP); Tatehito Usui, Tokyo (JP); Shigeru Nakamoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,176

(22) Filed: Aug. 1, 2022

(65) Prior Publication Data

US 2022/0367298 A1 Nov. 17, 2022

Related U.S. Application Data

(63) Continuation of application No. 17/038,024, filed on Sep. 30, 2020, now Pat. No. 11,437,289.

(51) Int. Cl.
*H01L 21/66* (2006.01)
*H01J 37/32* (2006.01)
(Continued)

(52) U.S. Cl.
CPC ........ *H01L 22/26* (2013.01); *H01J 37/32834* (2013.01); *H01J 37/32963* (2013.01);
(Continued)

(58) Field of Classification Search
CPC ............... H01L 22/26; H01L 21/67253; H01L 21/67069; H01L 21/32137; H01J 37/32963

See application file for complete search history.

(56) References Cited

U.S. PATENT DOCUMENTS

| 4,675,072 A | 6/1987 | Bennett |
| 6,824,813 B1 | 11/2004 | Lill |

(Continued)

FOREIGN PATENT DOCUMENTS

| JP | 2001085388 A | 3/2001 |
| JP | 2002081917 A | 3/2002 |

(Continued)

OTHER PUBLICATIONS

Office Action mailed Oct. 4, 2021 in U.S. Appl. No. 17/038,024.

(Continued)

*Primary Examiner* — Binh X Tran
(74) *Attorney, Agent, or Firm* — Miles & Stockbridge, P.C.

(57) ABSTRACT

A plasma processing method to detect and process a thickness of the processing target film with high accuracy when a fine shape of the semiconductor wafer surface varies, including detecting a state of a processing target film of a processing target material that is processed inside a vacuum processing chamber; detecting light emission of the plasma; obtaining a differential waveform data of the light emission of the plasma; storing a plurality of pieces of differential waveform pattern data in advance; calculating an estimated value of the film thickness of the processing target film processed on the processing target material by weighting based on differences between the differential waveform data obtained and the plurality of pieces of differential waveform pattern data stored; and determining an end point of processing using the plasma based on the estimated value of the film thickness of the processing target film calculated.

12 Claims, 8 Drawing Sheets

(51) Int. Cl.
*H01L 21/3213* (2006.01)
*H01L 21/67* (2006.01)

(52) U.S. Cl.
CPC .. *H01L 21/32137* (2013.01); *H01L 21/32139* (2013.01); *H01L 21/67069* (2013.01); *H01L 21/67253* (2013.01); *H01J 2237/334* (2013.01)

(56) References Cited

U.S. PATENT DOCUMENTS

| | | | |
|---|---|---|---|
| 11,437,289 B2* | 9/2022 | Fukuchi | ............ H01L 21/67253 |
| 2003/0211738 A1 | 11/2003 | Nagata | |
| 2007/0202613 A1* | 8/2007 | Usui | .................. G01B 11/0625 438/14 |
| 2014/0295583 A1 | 10/2014 | Nakamoto et al. | |
| 2016/0211186 A1 | 7/2016 | Nakamoto et al. | |
| 2016/0284610 A1 | 9/2016 | Usui et al. | |
| 2016/0336154 A1 | 11/2016 | Watanabe et al. | |
| 2016/0351405 A1* | 12/2016 | Fukuchi | ............ H01J 37/32009 |
| 2018/0269119 A1 | 9/2018 | Coppa et al. | |
| 2018/0277377 A1 | 9/2018 | Eto et al. | |
| 2022/0148862 A1 | 5/2022 | Lian et al. | |

FOREIGN PATENT DOCUMENTS

| | | |
|---|---|---|
| JP | 2003083720 A | 3/2003 |
| JP | 2007234666 A | 9/2007 |
| JP | 2010034582 A | 2/2010 |
| JP | 2016184638 A | 10/2016 |

OTHER PUBLICATIONS

Allowance mailed May 6, 2022 in U.S. Appl. No. 17/038,024.
Office Action mailed Dec. 7, 2023 in U.S. Appl. No. 17/482,595.
Notice of Allowance mailed Mar. 28, 2024 in U.S. Appl. No. 17/482,595.

* cited by examiner

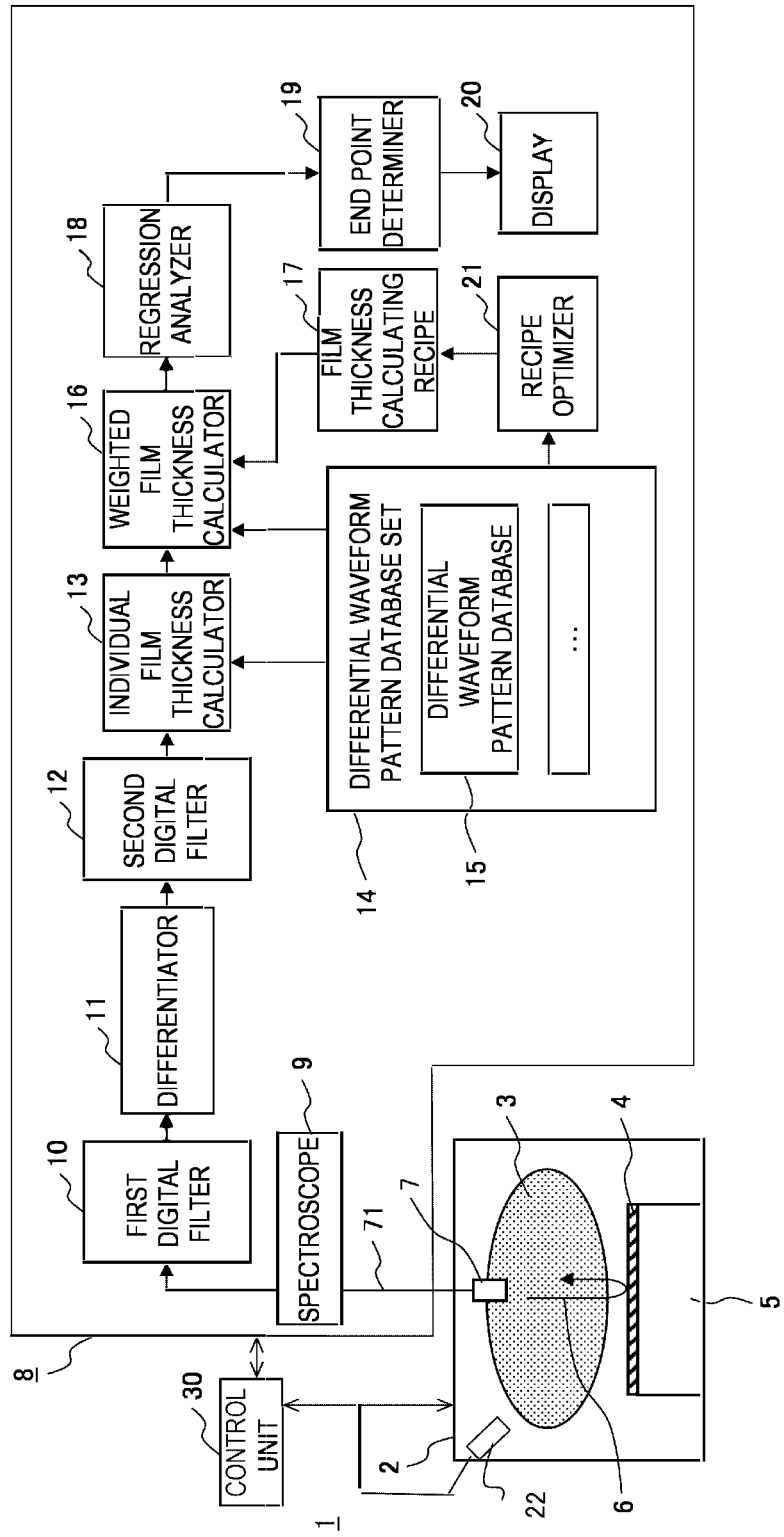

FIG. 3A

| | |
|---|---|
| | ... |
| $r(1)_{s-1}$ → | 151.3 |
| $r(1)_s$ → | 149.8 |
| | ... |
| $r(m)_{s-1}$ → | 152.4 |
| $r(m)_s$ → | 150.1 |
| | ... |

| | | | | |
|---|---|---|---|---|
| $Q(1)_{s-1,1}$ → | ... | ... | ... | ... |
| | 0.52 | 0.43 | ... | 0.36 |
| $Q(1)_{s,1}$ → | 0.61 | 0.57 | ... | 0.37 |
| $Q(m)_{s-1,1}$ → | ... | ... | ... | ... |
| | 0.36 | 0.42 | ... | 0.34 |
| $Q(m)_{s,1}$ → | 0.38 | 0.43 | ... | 0.35 |
| | ... | ... | ... | ... |

Q:302

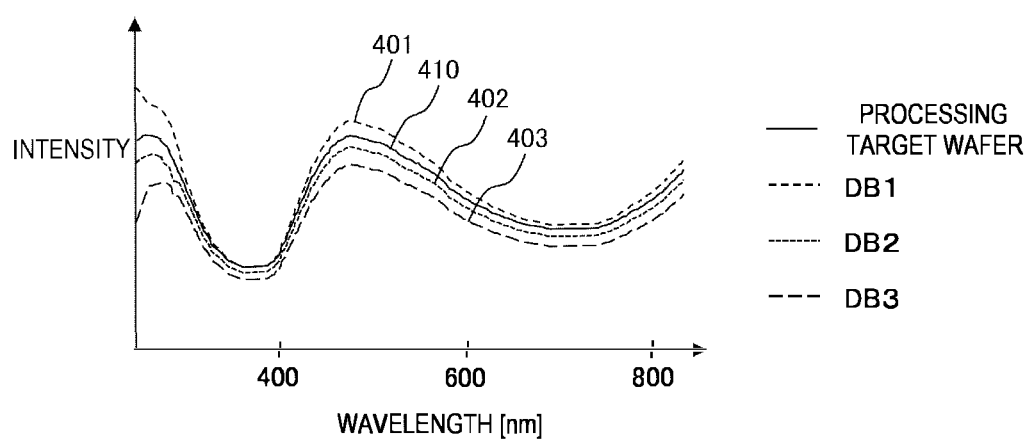

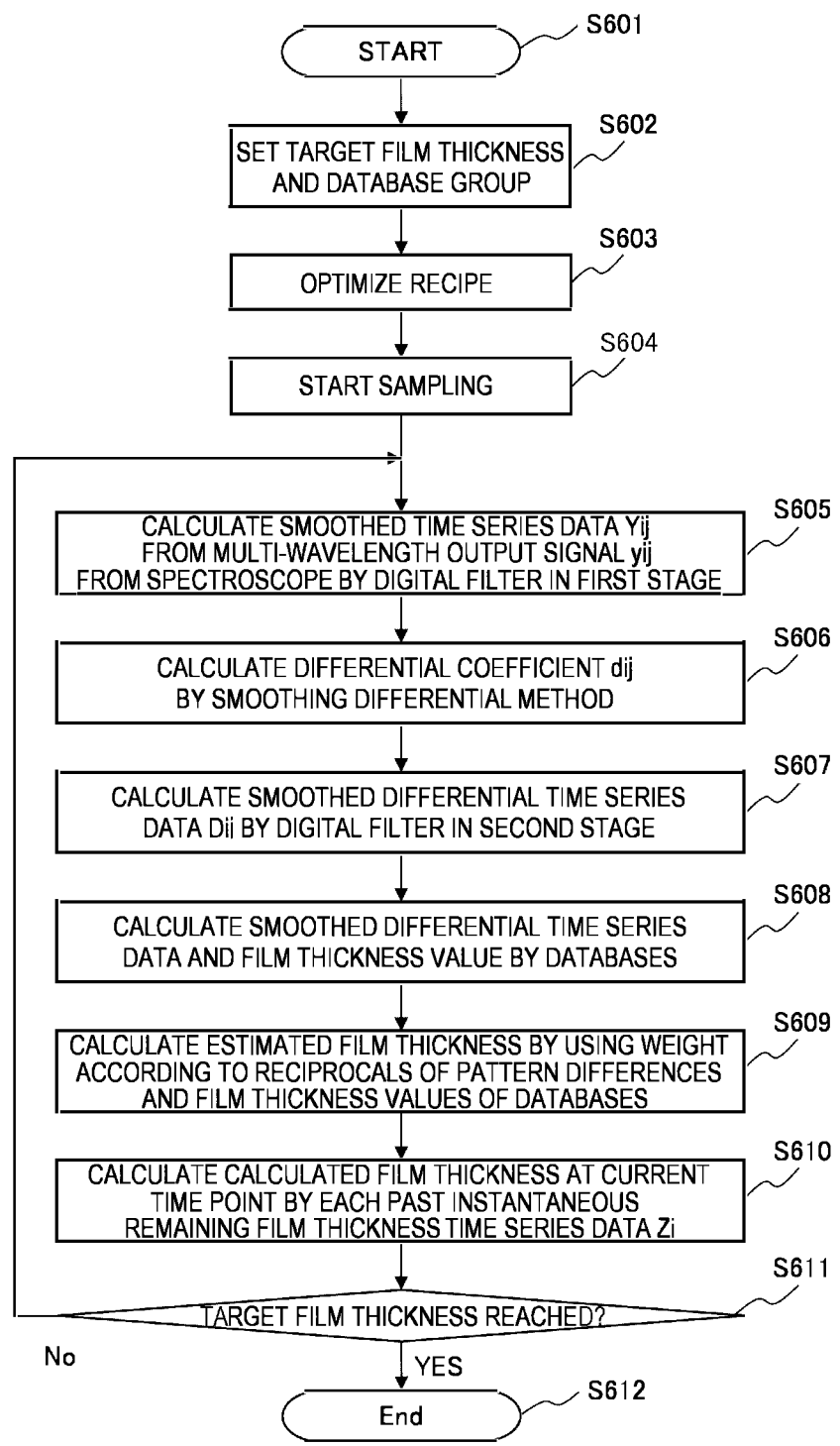

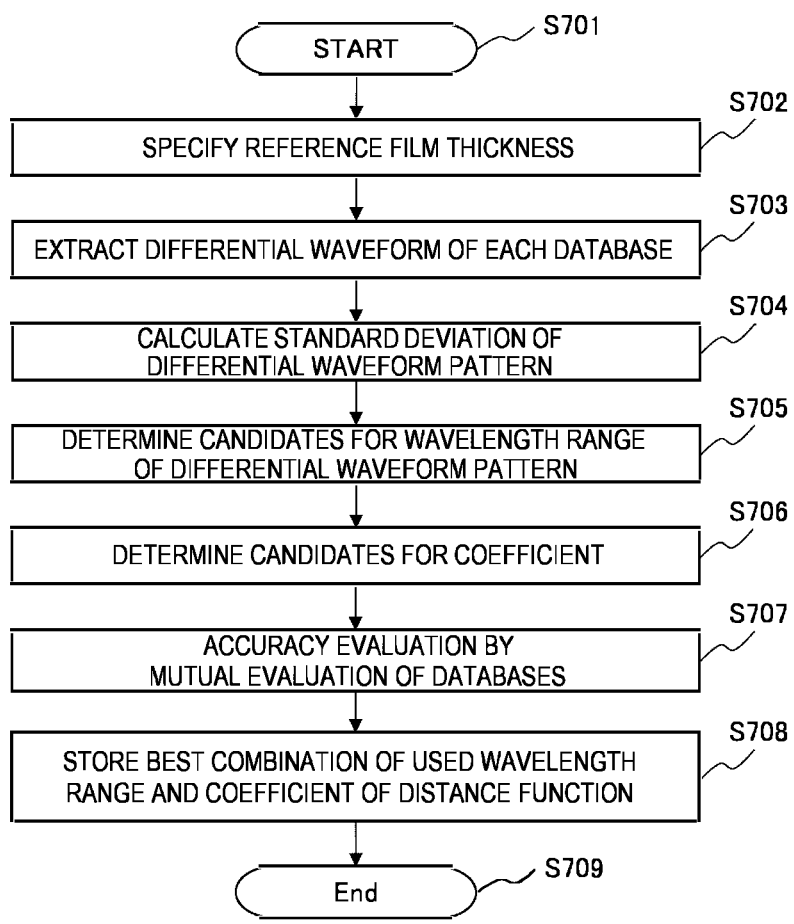

PLASMA PROCESSING APPARATUS AND PLASMA PROCESSING METHOD

BACKGROUND OF THE INVENTION

1. Field of the Invention

The present invention relates to a processing apparatus and a processing method for a processing target material in manufacture of a semiconductor integrated circuit and the like, and particularly relates to a plasma processing apparatus and a plasma processing method suitable for accurately detecting etching amounts of various layers provided on a substrate by etching processing using plasma discharge and processing to a desired film thickness and etching depth.

2. Description of the Related Art

In manufacture of a semiconductor device, a process using a dry etching apparatus is widely used for removal or pattern formation of layers of various materials and particularly layers of dielectric materials formed on a surface of a semiconductor wafer.

In the dry etching apparatus, processing gas introduced into a vacuum processing chamber is converted into plasma containing ions and radicals, and the ions and radicals are reacted with the layers formed on the surface of the semiconductor wafer, thereby performing an etching process of the semiconductor wafer.

What is important in the etching process is to accurately detect an etching end point for stopping the etching process at the desired film thickness and etching depth during the processing of such a layer.

During dry etching processing of the semiconductor wafer, an emission intensity of a specific wavelength in plasma light changes as etching of a specific film progresses. Therefore, as one method for determining the etching end point of the semiconductor wafer, in related arts, there is a method in which in a dry etching processing, a change in an emission intensity of a specific wavelength from plasma is detected, and an etching end point of a specific film is detected based on the detection result.

As an example of such a technique in the related arts, a technique described in JP-A-2007-234666 (PTL 1) has been known. In the technique in the related art, a method of performing end point determination based on a time change of an amount of reflected light from a semiconductor wafer during etching is described.

Since the amount of the reflected light from the semiconductor wafer changes depending on film thicknesses of layers other than a layer being processed, JP-A-2016-184638 (PTL 2) has been known in the related arts as a method for accurately detecting an end point under such a condition. In the technique in the related art, a highly accurate film thickness estimation method when a film thickness of a layer under a processing target film (base film thickness) is different is disclosed.

PTL 1 discloses a method of obtaining a characteristic behavior of time change of interference light by detection, creating a database based on the behavior, and determining the end of etching by comparing the database and a detected interference waveform. The database is created by setting a standard pattern showing a wavelength dependence of the interference light with respect to an etching amount of a processing target material such as a semiconductor wafer that is used for samples (semiconductor wafer used for samples) when plasma etching the processing target material.

PTL 2 describes preparing interference spectrum patterns (interference patterns) with different base film thicknesses as databases, creating a database generated by synthesizing two databases, comparing the synthesized database and a detected interference pattern, calculating an estimated film thickness value at each time point, and determining the end point.

However, in the above-described related arts, in addition to the base film thickness, a mask film thickness varies, a mask width varies, and the film thickness varies depending on a position on the semiconductor wafer of the processing target film, and when various variations such as the above ones occur in a fine shape of a semiconductor wafer surface, highly accurate film thickness estimation cannot be achieved.

For example, consider a case where the base film thickness and the mask film thickness are different, and the fine shape of the semiconductor wafer to be processed has a slightly thick base film thickness or a slightly thick mask film thickness. In this case, it is necessary to prepare a database of interference spectrum patterns obtained from four semiconductor wafers whose base film thickness is thick or thin and whose the mask film thickness is thick or thin, and to synthesize the above appropriately, whereas neither PTL 1 nor PTL 2 discloses such a method.

In consideration of the above-mentioned problems of the related arts, an object of the present invention is to provide a plasma processing apparatus and a plasma processing method that can accurately detect or control the remaining film thickness of the processing target film even when two or more variations occur in the fine shape of the semiconductor wafer surface (for example, the base film thickness and the mask film thickness).

SUMMARY OF THE INVENTION

In order to achieve the above object, a plasma processing apparatus according to the invention includes: a vacuum processing chamber configured to generate plasma in a state where an inside of the vacuum processing chamber is exhausted to vacuum, so as to process a processing target material; a processing state detection unit configured to detect a state of a processing target film of the processing target material which is processed inside the vacuum processing chamber; and a control unit configured to control the vacuum processing chamber and the processing state detection unit. The processing state detection unit includes: a light emission detection unit configured to detect light emission of the plasma generated inside the vacuum processing chamber; a calculation unit configured to obtain a differential waveform data of the light emission of the plasma detected by the light emission detection unit; a database unit that stores a plurality of pieces of differential waveform pattern data in advance; a film thickness calculation unit configured to calculate an estimated value of the film thickness of the processing target film processed on the processing target material by weighting based on differences between the differential waveform data obtained by the calculation unit and the plurality of pieces of differential waveform pattern data stored in the database unit; and an endpoint determination unit configured to determine an end point of processing using the plasma based on the estimated value of the film thickness of the processing target film calculated by the film thickness calculation unit.

In order to achieve the above object, a plasma processing method for processing a film to be processed contained in a plurality of film layers formed on a surface of a wafer arranged inside of a processing chamber with a plasma generated in the processing chamber, the method comprising: detecting time-series data related to a light from inside of the processing chamber by detecting light from the inside of the processing chamber at a plurality of times during the processing of the wafer; calculating a thickness of the film to be processed by comparing an actual pattern data indicating intensities or differential coefficients in a plurality of wavelengths of the light obtained from the time-series data using the plurality of wavelengths of the light as a parameter and a pattern data for detection obtained in advance by using multiple pattern data, in each of which a remaining film thickness of the film to be processed during the processing and the pattern data relating to the light using the plurality of wavelengths of the light as the parameter are associated with each other, the multiple pattern data having variations in values with the plurality of the wavelengths of the light and the pattern data for detection obtained by using the multiple pattern data excluding the data in each of the plurality of wavelengths having a larger deviation value than a predetermined reference value among the multiple pattern data; and determining an end point of the processing of the wafer using the plasma based on the value of the calculated film thickness.

According to the invention, even when various variations occur in the fine shape of the semiconductor wafer, a processing amount or a remaining film thickness of the processing target film can be detected with high accuracy.

According to the invention, highly accurate film thickness estimation and end point determination under various structural variations between wafers, lots, and the like can be achieved, and a yield of device manufacturing can be improved.

BRIEF DESCRIPTION OF THE DRAWINGS

FIG. 1 is a block diagram showing a schematic configuration of a plasma processing apparatus according to an embodiment of the invention.

FIG. 3A is an explanatory diagram of matrix data used in calculation according to the embodiment of the invention.

FIG. 3B is an explanatory diagram of the matrix data used in the calculation according to the embodiment of the invention.

FIG. 4 is a graph showing a differential waveform pattern used in the calculation according to the embodiment of the invention.

FIG. 6 is a flowchart showing a procedure for calculating a remaining film thickness or an etching amount of the processing target film in the etching process according to the embodiment of the invention.

FIG. 7 is a flowchart showing a detailed procedure of recipe optimization in step S603 of the flowchart in FIG. 6.

DESCRIPTION OF THE PREFERRED EMBODIMENTS

Figure 2A:
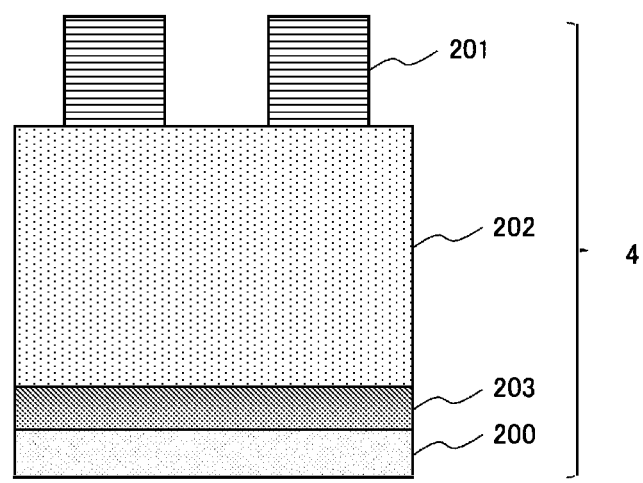
FIG. 2A is a cross-sectional view of a processing target material according to the embodiment of the invention, showing a state before processing.

According to the invention, a plasma processing apparatus is equipped with an etching amount measuring unit having a plurality of interference spectra of various film thicknesses and structures in databases. The etching amount measuring unit mixes the film thicknesses of the databases based on distances between an interference spectrum during etching and the databases, and determines an estimated film thickness value, and thereby film thickness estimation with high accuracy can be achieved even in a case where variations exist in film thickness and structure other than the base film thickness.

A specific procedure for estimating the film thickness in the invention will be described below.

(a) Prepare a plurality of databases having different interference spectrum patterns due to various film thicknesses and structures.

(b) Calculate weights according to differences between the interference spectrum pattern during wafer processing and the patterns of the interference spectra of the databases, and calculate the estimated film thickness value by using the weights and the film thickness values of the databases.

(c) Determine that a target is reached by using the estimated film thickness.

Here, as for explaining the calculation of the estimated film thickness value more specifically, a wavelength range of an interference spectrum is optimized by using data on interference spectrum and film thickness collected in advance. Specifically, a wavelength range in which interference spectra have a large variation in the same film thickness is excluded, and accuracy is evaluated by mutual film thickness estimation between databases. If the accuracy is good, the wavelength range is used for the film thickness estimation.

In the present invention, in the plasma processing apparatus and the plasma processing method, by using three or more interference light patterns for synthesis weighted in accordance with a value of a difference between an actual interference light pattern during processing and the actual interference light pattern for synthesis, and synthesizing film thicknesses respectively calculated from the interference light patterns for synthesis according to the weights, the film thickness during processing can be detected.

According to the invention, considering that fine shapes on semiconductor wafer surfaces are different, differential waveform pattern databases of the interference light obtained from a plurality of semiconductor wafers are registered, a time derivative for each of the plurality of wavelengths of the interference light obtained from the semiconductor wafer surface during the etching processing is obtained, a differential value pattern of the waveform of the interference light is obtained, and weights based on the pattern differences between the pattern and the plurality of differential waveform pattern databases are respectively calculated for the differential waveform pattern databases.

The invention relates to a plasma processing apparatus and a plasma processing method capable of detecting the remaining film thickness of the processing target film with high accuracy by calculating a weighted sum of film thicknesses calculated from the differential waveform pattern databases using the weights described above, by using pattern databases whose fine shapes are more similar to that of the processing target semiconductor wafer.

Hereinafter, an embodiment according to the invention will be described in detail with reference to drawings. In all the drawings for explaining the present embodiment, those having same functions are denoted by same reference numerals, and repeated descriptions thereof will be omitted in principle.

However, the invention should not be construed as being limited to the description of the embodiment described below. Those skilled in the art could have easily understood that specific configurations can be changed without departing from the spirit or scope of the invention.

First Embodiment

Hereinafter, with reference to FIGS. 1 to 5, an overall configuration of the plasma processing apparatus for a semiconductor wafer provided with means for detecting the etching amount (here, the actual etching depth and the film thickness of the processing material) according to the invention will be described.

The plasma processing apparatus according to the embodiment of the invention is shown in FIG. 1. The plasma processing apparatus 1 includes a vacuum processing chamber 2, an etching amount measuring unit 8, and a control unit 30.

The vacuum processing chamber 2 includes, on an inside thereof, a sample table 5 on which a processing target material 4 such as a semiconductor wafer is placed, a light receiver 7 for detecting light emitted from the plasma 3 generated inside, an optical fiber 71 that transmits the light emitted from the plasma 3 received by the light receiver 7, and a light source 22 that irradiates the processing target material 4 with light. The vacuum processing chamber 2 further includes a gas introducing unit for introducing gas into the inside, a vacuum exhausting unit for exhausting the inside into vacuum, a power supply unit for supplying electric power, and the like (not shown for the sake of simplicity).

The etching amount measuring unit 8 includes a spectroscope 9, a first digital filter 10, a differentiator 11, a second digital filter 12, an individual film thickness calculator 13, a differential waveform pattern database set 14, a differential waveform pattern database 15, a weighted film thickness calculator 16 for calculating a film thickness 210 of the processing target film, a film thickness calculating recipe 17 used for calculation of the weighted film thickness calculator 16, a regression analyzer 18, an end point determiner 19 that determines the end of etching based on a result of the regression analyzer 18, a display 20 that displays a determination result of the end point determiner 19, and a recipe optimizer 21 that optimizes the values of the film thickness calculating recipe 17.

The etching amount measuring unit 8 in FIG. 1 shows a functional configuration, and an actual configuration of the etching amount measuring unit 8 excluding the display 20 and the spectroscope 9 can include: a CPU; a storage device including a ROM that holds various data such as an etching depth and film thickness detection processing program and a differential waveform pattern database of interference light 6, a RAM for holding detection data, and an external storage device; a data input and output device; and a communication control device.

The control unit 30 receives a signal from the etching amount measuring unit 8 and a signal from the outside, and controls the gas introducing unit, the vacuum exhausting unit, the power supply unit, and the like (not shown) connected to the vacuum processing chamber 2.

Etching gas introduced into the inside of the vacuum processing chamber 2 from the gas introducing unit (not shown) is decomposed into the plasma 3 by microwave power or the like supplied from the power supply unit (not shown), and the plasma etches the processing target material 4, such as the semiconductor wafer, on the sample table 5.

The light emitted from the plasma 3 is directly received by the light receiver 7, or is partially received by the light receiver 7 after being reflected by the processing target material 4 such as a semiconductor wafer, such as the interference light 6, and is introduced into the spectroscope 9 from the vacuum processing chamber 2 through the optical fiber 71. In the spectroscope 9, the incident light emission of the plasma is separated and light intensities are converted into a digital signal. Instead of emitting light from the plasma 3, light may be irradiated from the light source 22 to the processing target material 4, and reflected light may be measured by the spectroscope 9.

FIG. 2A shows a fine shape of a surface of the processing target material 4, which is to be etched. The processing target material 4, such as a semiconductor wafer, is formed by laminating, for example, a processing target film 202 containing polysilicon or the like and a base film 203 including an oxide film or the like on a silicon substrate 200. A pattern of the mask 201 made of a resist or the like is formed on the processing target film 202.

Figure 2B:
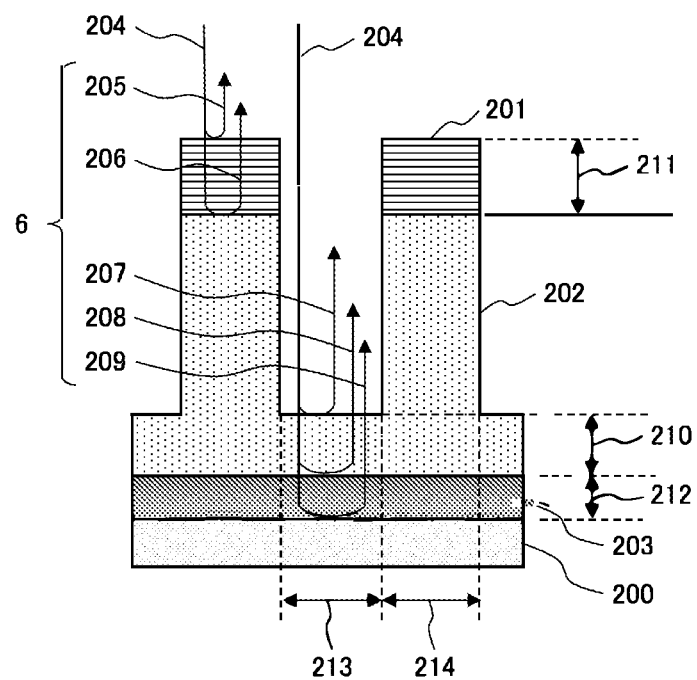
FIG. 2B is a cross-sectional view of the processing target material according to the embodiment of the invention, showing a state during the processing.

FIG. 2B is a schematic view when the processing target film 202 is being etched. The plasma light 204 incident on the processing target material 4 is reflected on the surface of the processing target material 4, in which, first, reflected light 205 on the surface of the mask 201 and reflected light 206 at a boundary between the mask 201 and the processing target film 202 exist. Also, reflected light 207 on the surface of the processing target film 202 in a part where the processing target film 202 is exposed and not covered with the mask 201, reflected light 208 at a boundary between the processing target film 202 and the base film 203, and reflected light 209 at a boundary between the base film 203 and the silicon substrate 200 exist.

Interference light is formed because an optical path difference occurs between the reflected lights. Since a thickness of the processing target film 202 decreases as the etching progresses, the optical path difference of each reflected light changes, and an interference phenomenon having a different period for each wavelength occurs. Among the multi-wavelength interference lights 6, multi-wavelength interference light 6 received by the light receiver 7 is guided to the spectroscope 9 of the etching amount measuring unit 8 via the optical fiber 71, and based on this state, the etching amount of the processing target film 202 is measured and the end point determination of a process (here, etching) is performed.

In FIG. 2B, the film thickness as a film thickness to be detected is the film thickness 210 of the processing target film 202. However, the multi-wavelength interference light received by the light receiver 7 and measured by the spectroscope 9 varies depending on variations in the fine shape of the semiconductor wafer, such as variations for each of the mask film thickness 211, the base film thickness 212, an area ratio of processing target film area 213 to a mask area 214, and a position on the semiconductor wafer of the film thickness 210 of the processing target film. The variations are main reason of errors in detecting the film thickness 210 of the processing target film.

The multi-wavelength interference light 6 with respect to the processing target material 4 taken in by the spectroscope 9 becomes current detection signals corresponding to the emission intensities of the wavelengths respectively, and the current detection signals are converted into voltage signals. A plurality of signals having specific wavelengths output as sampling signals obtained by the spectroscope 9 at any sampling time point i are temporarily stored in a storage device such as a RAM (not shown) as time series data yij. Here, j indicates a wavelength.

Next, the time series data yij output from the spectroscope 9 and temporarily stored in a storage device such as a RAM is transmitted to the first digital filter 10, waveforms having a frequency higher than a predetermined frequency, which are noise components, are removed, thereby smoothing processing is performed, and smoothed time series data Yij is temporarily stored in the storage device such as a RAM (not shown).

The smoothed time series data Yij temporarily stored in the storage device such as a RAM is transmitted to the differentiator 11, and the time series data dij of a differential value (first order differential value or second order differential value) at a predetermined sampling time point i is calculated and stored in the storage device such as a RAM (not shown). The time series data dij of the differential value temporarily stored in the storage device such as a RAM is transmitted to the second digital filter 12, smoothing processing is performed again, and smoothed differential coefficient time series data Dij is stored in the storage device such as a RAM (not shown).

Here, the calculation of the smoothed differential coefficient time series data Di will be described. A secondary Butterworth type low pass filter, for example, is used as the first digital filter 10. Smoothed time series data Yi by the secondary Butterworth type low pass filter is obtained by Equation (1).

$$Yi = b1 \cdot yi + b2 \cdot yi-1 + b3 \cdot yi-2 - [a2 Yi-1 + a3 \cdot Yi-2] \quad \text{(Equation 1)}$$

Here, coefficients a and b have different numerical values depending on a sampling frequency and a cutoff frequency. Coefficient values of the digital filter are, for example, a2=−1.143, a3=0.4128, b1=0.067455, b2=−0.013491, b3=0.067455 (sampling frequency is 10 Hz, and cutoff frequency is 1 Hz).

The time series data di of differential coefficient is calculated by the differentiator 11 from Equation (2) using a polynomial adapted smoothing differential method with the time series data Yi at five points as follows.

$$di = \sum_{k=-2}^{k=2} \omega k \cdot Yi + k \quad \text{(Equation 2)}$$

Here, with respect to the weight coefficient ω, $\omega_{-2}=2$, $\omega_{-1}=-1$, $\omega_0=-2$, $\omega_1=-1$, and $\omega_2=2$.

The smoothed differential coefficient time series data Di by using the time series data di of the differential coefficient is calculated as follows from Equation (3) by, for example, a secondary Butterworth type low pass filter as the second digital filter 12.

$$Di = b1 \cdot di + b2 \cdot di-1 + b3 \cdot di-2 - [a2 \cdot Di-1 + a3 \cdot Di-2] \quad \text{(Equation 3)}$$

The calculation can be performed for each wavelength j to obtain smoothed differential coefficient time series data Dij. A value obtained by dividing the smoothed differential coefficient time series data Dij by the smoothed time series data Yij is used as Dij in subsequent calculations. The smoothed differential coefficient time series data Dij may also be used as it is.

On the other hand, the differential waveform pattern database set 14 holds three or more differential waveform pattern databases 15. Each of the differential waveform pattern databases 15, stores in advance interference light pattern data P(m)sj obtained when a test processing target material having the same material, shape, and composition as the processing target material 4 which is to be processed for manufacturing a semiconductor device and a film structure on a surface thereof is etched under the same condition as the processing target material 4.

The differential waveform pattern database 15 stores a plurality of pieces of data measured in a plurality of different test processing target materials. m indicates an ID of a database, s indicates an elapsed time at a time of sampling counted from a start of the processing, and j indicates an emission wavelength. The interference light pattern data P(m)sj includes a pattern of intensity of the interference light from the processing target film, which corresponds to different remaining film thicknesses of the processing target film or a value of data indicating the remaining film thickness.

When the etching proceeds in a lateral direction as well, a parameter indicating a width of the processing target film area 213 or a width of the mask area 214 may be included instead of the remaining film thickness. The differential waveform pattern database 15 is stored in a memory device as a RAM or ROM, or a storage device such as a hard disk or a DVD disk inside the etching amount measuring unit 8 (not shown).

The differential waveform pattern databases 15 stored in the differential waveform pattern database set 14 is obtained from materials to be processed having slightly different fine shapes, such as thicker and thinner masks 201, due to manufacturing variations and the like. The differential waveform pattern databases 15 may be created by preparing test materials to be processed having slightly different fine shapes.

The individual film thickness calculator 13 is a process of extracting the remaining film thickness of the processing target film and the interference light pattern data P(m) sj from the above-mentioned differential waveform pattern databases 15. For example, for each of the above differential waveform pattern databases 15, data in which s is equal to or longer than a predetermined elapsed time and remaining film thickness data corresponding to the time may be extracted.

An elapsed time having the smallest pattern difference and a film thickness value at the time may be detected by comparing each of the above differential waveform pattern databases 15 with the actual pattern Dij of the interference light corresponding to the predetermined elapsed time. That is, differences between the pattern data P(m)sj stored in the differential waveform pattern databases 15 and the actual pattern Dij may be calculated, pattern data having the smallest difference value may be obtained, and the remaining film thickness corresponding to the pattern data may be extracted.

The interference light pattern data extracted in such manner is called Q(m)sj. The data is associated with a remaining film thickness at the elapsed time. The associated remaining film thickness is called r(m)s.

The weighted film thickness calculator 16 calculates a value of an instantaneous film thickness value Zi at the time point i by using the interference light pattern data Q(m)sj and the remaining film thickness data r (m) s extracted for each database. In order to calculate the instantaneous film thickness value Zi, a matrix R: 301 shown in FIG. 3A and a matrix Q: 302 shown in FIG. 3B are created here.

Figures 3A, 3B:
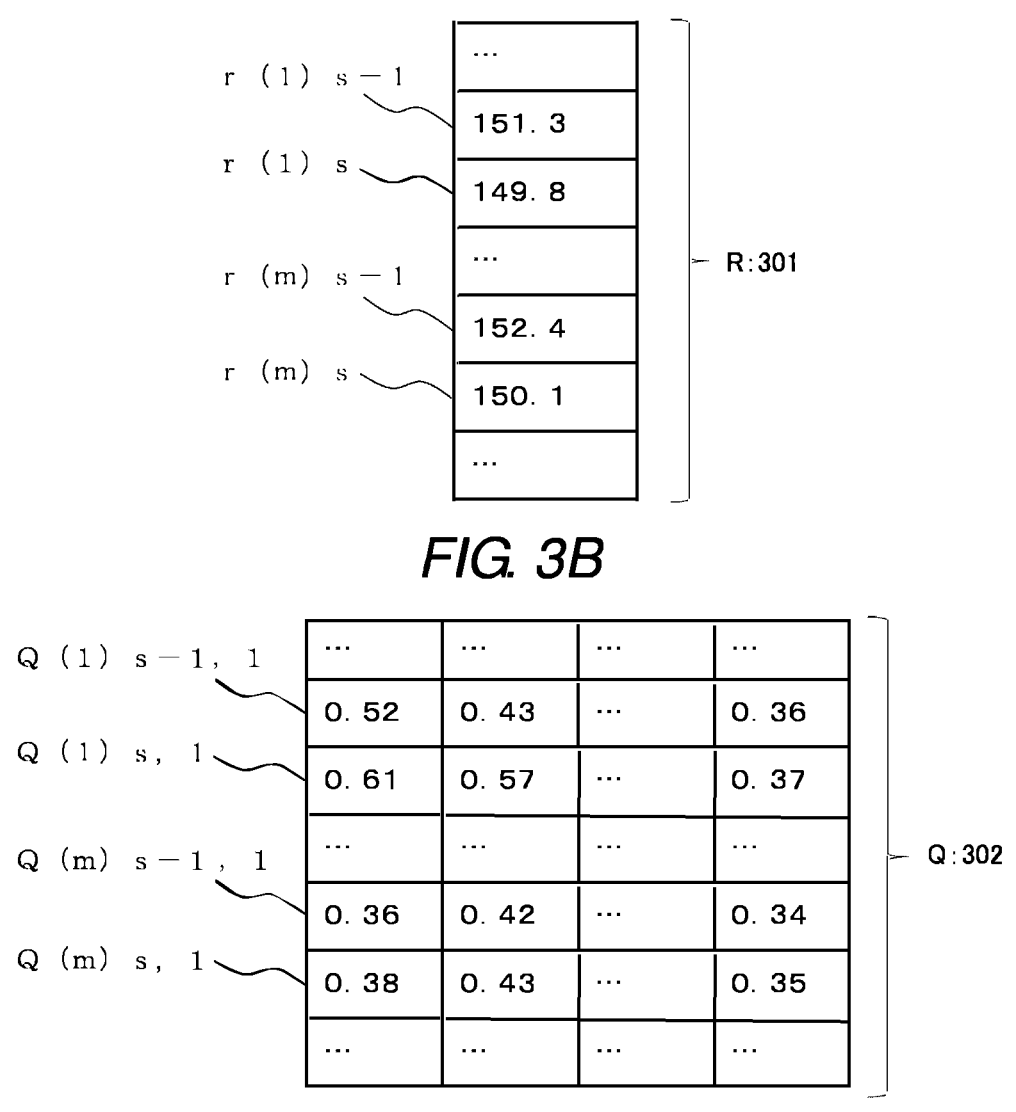

The matrix R: 301 in FIG. 3A is a matrix in which r(m)s are connected in an order from m=1 in a row direction. In the following, an element on the uth row is represented by Ru. The matrix Q: 302 in FIG. 3B is a matrix in which Q(m)sj are connected in an order from m=1 in a row direction. In the following, an element on the uth row and the with column is represented by Quv. Ru and Quv are each associated with the same elapsed time in the same database. In the following, N is used as the number of rows.

The value of the instantaneous film thickness value Zi is calculated by the following Equations (4) and (5).

$$Zi = R^T \cdot A \cdot W \quad \text{(Equation 4)}$$

The above is a matrix calculation formula, and A and W are the following matrices, respectively. T represents a transpose.

A: a matrix for correction having N rows and N columns. A may also be a diagonal matrix having N rows and N columns, in which each element is a reciprocal of a sum of elements of W. Also, A may be an inverse matrix of (K-λI) like Kernel ridge regression. Here, K is a matrix having N rows and N columns in which an element on the uth row and the with column is kuv represented by the following Equation (5). λ is an arbitrary coefficient, and I is an identity matrix having N rows and N columns whose elements are 1.

$$kuv = \exp\left(-\sum_j (Quj - Qvj)^2 / 2\sigma^2\right) \quad \text{(Equation 5)}$$

In the above Equation (5), a wavelength range for summing j and a coefficient σ are specified by the values stored in the film thickness calculating recipe 17. exp is an exponential function with a base of the natural logarithm.

W: each element shows a weight according to a pattern difference between the smoothed differential value time series data Dij at the time point i and data in each database. For example, a value of the uth element Wu is calculated by a function that monotonically decreases according to a magnitude of the pattern difference, as in the following Equation (6).

$$wu = \exp\left(-\sum_j (Dij - - Quj)^2 / 2\sigma^2\right) \quad \text{(Equation 6)}$$

In the above Equation (6), the wavelength range for summing j and the coefficient σ are specified by values stored in the film thickness calculating recipe 17 in the same manner as in the Equation (5).

By using the above Equation (6), the differential waveform pattern of the processing target material 4 at the time point i and the differential waveform pattern of each database that are more similar have a large value, and those that are less similar obtains a small weight. By using such weights in the Equation (4), the instantaneous film thickness value Zi is calculated from the remaining film thickness in databases having similar differential waveform patterns.

For example, as shown in FIG. 4, when a differential waveform pattern 410 of the processing target material 4 and differential waveform patterns 401 to 403 of databases are obtained, by giving large weights to the differential waveform pattern 401 of DB1 and the differential waveform pattern 402 of DB2, and giving a small weight to the differential waveform pattern 403 of DB3, the instantaneous film thickness value Zi is calculated from the differential waveform pattern 401 of DB1 and the differential waveform pattern 402 of DB2, which are closer to the differential waveform pattern.

If the fine shape on the surface of the processing target material 4 is similar, the differential waveform pattern of the interference light also takes a similar pattern, and therefore, as a result, the instantaneous film thickness value Zi can be calculated using a database having a similar fine shape on the surface of the processing target material 4. A calculation equation of the weight Wu is not limited to Equation (6), and may be a function in which a small weight is calculated when the pattern difference is large.

The instantaneous film thickness value at the sampling time point is detected as Zi, and the value of the instantaneous film thickness value Zi is stored in the storage device in the etching amount measuring unit 8 as time series data.

The film thickness calculating recipe 17 is data for designating a wavelength range for summing in the above-mentioned equations (5) and (6) and the coefficient σ in the equations. The data may be determined by the designer or may be set by the recipe optimizer 21 to be described later.

In the regression analyzer 18, at the same time when an output from the weighted film thickness calculator 16 is received or data of the instantaneous film thickness Zi at the sampling time point i stored in the storage device is read, an instantaneous film thickness value before the time point i is read from the storage device, and the output or the data of the instantaneous film thickness Zi and the instantaneous film thickness value are used for a regression analysis, so as to calculate a film thickness value at the time point i from a result of regression line approximation.

That is, a first order regression line Y=Xa·t+Xb (Y: remaining film amount, t: etching time, Xa: an absolute value is an etching rate, Xb: initial film thickness) is obtained by the regression analyzer 18, and a value of a film thickness Yi (calculated film thickness) at the sampling time point is calculated from the regression line. When a desired remaining film thickness of the processing target film is smaller than the remaining film thickness in the differential waveform pattern database 15, the film thickness value of the time point i may be calculated using only the first order regression line without calculating the instantaneous film thickness Zi.

Next, the data indicating the obtained value of the calculated film thickness Yi is transmitted to the end point determiner 19, in the end point determiner 19, the value of the film thickness Yi and a film thickness value that is a target of the etching processing (target film thickness) are compared, and when it is determined that the film thickness Yi is equal to or smaller than the target film thickness value, it is regarded that the etching amount of the film to be etched of the processing target material 4 arrives the target, and a result thereof is displayed on the display 20.

After that, generation of an electric field or a magnetic field of the plasma forming portion is stopped, the plasma 3 disappears, and the etching process of the processing target material 4 is completed, and then the processing conditions such as gas and pressure for the etching processing are changed to process the film to be etched.

Figure 5A:
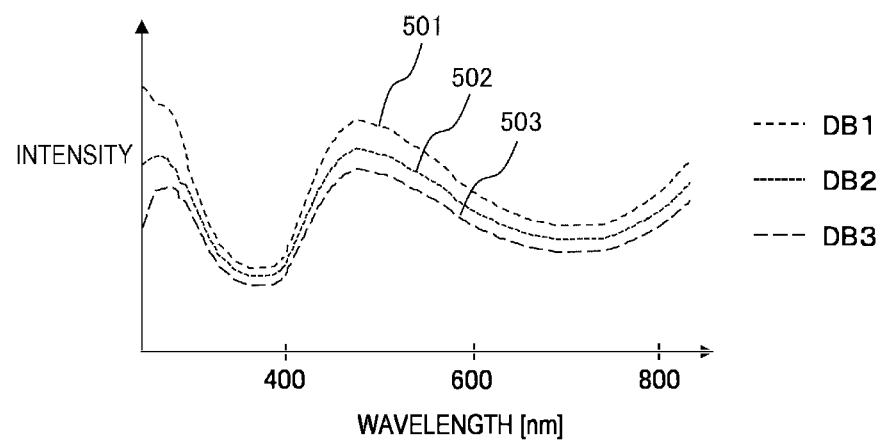
FIG. 5A is a graph showing variations in a differential waveform pattern extracted from a database used in the calculation according to the embodiment of the invention.

The recipe optimizer 21 performs a processing of setting the above-described film thickness calculating recipe 17. This is performed as a pre-processing before plasma processing of the processing target material 4 starts. The recipe optimizer 21 extracts a differential waveform pattern at a specified remaining film thickness (for example, target film thickness) from each database among the differential waveform pattern databases 15. Extracted differential waveform pattern 501 of the DB1, differential waveform pattern 502 of the DB2, and differential waveform pattern 503 of the DB3 are shown in FIG. 5A.

Figure 5B:
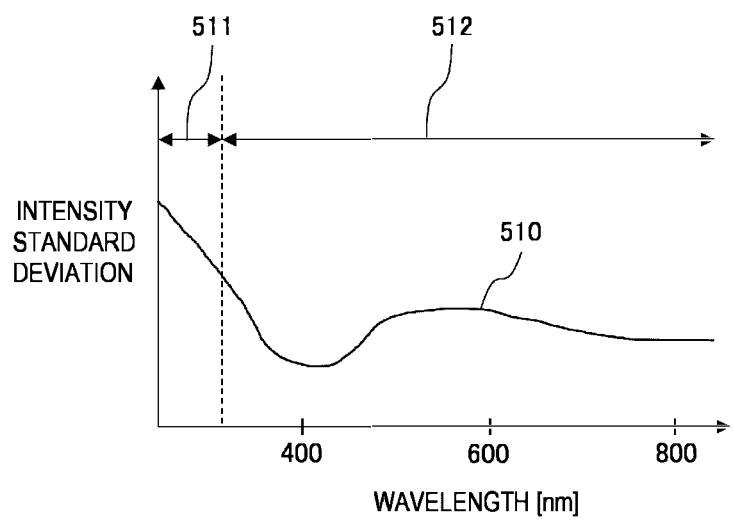
FIG. 5B is a graph showing a standard deviation obtained from the variations in a differential waveform pattern extracted from a database used in the calculation according to the embodiment of the invention.

A standard deviation 510, which is a variation in intensity at each wavelength of the extracted differential waveform pattern, is calculated as shown in FIG. 5B. Since it is assumed that the intensity varies depending on factors other than the remaining film thickness, such as states of the plasma or the chamber, the accuracy can be improved by excluding the wavelength with a large variation.

Therefore, in FIG. 5B, the wavelength range is stored in the film thickness calculation recipe 17 such that the instantaneous film thickness Zi is calculated using only the wavelength range of 512, while excluding wavelengths having a large standard deviation as shown in 511 from wavelengths for summing in Equations (4) and (5).

The wavelength range to be excluded may be determined in relative magnitude such as the wavelength of top 10% or 20% of the variation among all wavelengths, or a threshold value may be set for the variation. When a differential waveform pattern of a database is divided into a plurality of groups, standard deviations for the groups may be calculated respectively, and an average thereof may be used.

To determine a percentage of wavelength ranges to be excluded, the recipe optimizer 21 extracts one database (DBp) among the differential waveform pattern databases 15 and calculates the instantaneous film thickness using the Equation (4) using the remaining differential waveform pattern databases 15.

For candidates in the plurality of wavelength ranges, for example, when the top 10% variation is excluded, and when the top 20% variation is excluded, respectively, an instantaneous film thickness Zs at the time point s of DBp is calculated, a difference from the film thickness r(m)s is calculated, and the wavelength range having a smaller difference is selected as an optimum wavelength range.

For the coefficients σ in the Equations (5) and (6), a plurality of coefficients σ may be set for calculating the instantaneous film thickness Zs, and combinations of the wavelength range and the coefficient σ may be processed to specify the combination having a small difference. The wavelength range and the coefficient σ specified in such manner are stored in the film thickness calculating recipe 17.

In the present embodiment, by using the Equation (6), the film thickness is calculated by a weighted sum of a plurality of databases having a small difference from the differential waveform pattern obtained from the processing target material 4 in the plurality of databases. Since a more similar differential waveform pattern can be obtained from processing target materials having similar fine shapes, even when the fine shape of the processing target material 4 varies, databases of processing target materials having similar fine shapes can be used, so that the end point can be determined accurately.

Next, a procedure for calculating the remaining film thickness or the etching amount of the processing target film when the etching processing is performed by the etching amount measuring unit 8 of FIG. 1 will be described using the flowchart of FIG. 6. FIG. 6 is a flowchart showing a flow of an operation for detecting a remaining film thickness etching amount of the plasma processing apparatus according to the embodiment shown in FIG. 1. FIG. 6 mainly shows a flow of an operation of the etching amount measuring unit 8. A processing starts from step S601.

In the embodiment, a value of a target remaining film thickness of the processing target film and a plurality of differential waveform pattern databases used for detection or determination thereof are set (step S602) prior to the processing of the processing target material 4.

In the differential waveform pattern databases, interference light pattern data obtained when the test processing target material having the same material, shape, and composition as the processing target material 4 which is to be processed for manufacturing the semiconductor device and the film structure on the surface thereof is etched under the same condition as the processing target material 4 is used as the data P(m)sj collected for the plurality of processing target materials.

Next, a processing of optimizing the wavelength range and the coefficient used for calculating the instantaneous film thickness is performed (step S603). The processing will be described with reference to a flowchart in FIG. 7 described later. A wavelength range and a coefficient specified in advance may be used without executing the processing.

Next, the plasma 3 is formed in the vacuum processing chamber 2, the processing on the film to be etched of the material 4 is started, and interference light obtained from the film to be etched during the etching processing is detected at predetermined sampling intervals (for example, 0.1 to 0.5 seconds) (step S604). At the time, a sampling start command is issued upon the start of the etching processing.

During the processing, an intensity of multi-wavelength interference light that changes as the etching progresses is transmitted to the spectroscope 9 of the etching amount measuring unit 8, and is detected and output by a light detection device thereof as a light detection signal having a voltage corresponding to the intensity of light at each predetermined frequency.

The light detection signal of the spectroscope 9 is digitally converted, and the sampling signal yij as a data signal associated with an arbitrary time point is acquired. Next, the multi-wavelength output signal yij from the spectroscope 9 is smoothed by the first digital filter 10 in a first stage, and the time series data Yij at the arbitrary time point is calculated (step S605).

Next, the time series data Yij is transmitted to the differentiator 11, and the time series differential coefficient dij is calculated by the polynomial adapted smoothing differential method (step S606). That is, the differential coefficient di of the signal waveform is detected by the polynomial adapted smoothing differential method.

The differential coefficient dij is transmitted to the second digital filter 12 in a second stage, and the smoothed differential coefficient time series data Dij is calculated (step S607). The obtained smoothed differential coefficient time series data Dij is divided by the smoothed time series data Yij and transmitted to the individual film thickness calculator 13.

Although the smoothed differential coefficient time series data Dij is used here, any value may be used as long as it is time series data that reflects the difference in the processing target material 4, such as Yij itself, or a value calculated by using a least squares method on Yij.

In the individual film thickness calculator 13, the remaining film thickness and the interference light pattern data Q(m)sj of the processing target film is extracted for each of the plurality of the differential waveform pattern databases 15 in the differential waveform pattern database set 14 (step S608).

For example, for each of the above differential waveform pattern databases 15, data in which s is equal to or longer than a predetermined elapsed time and remaining film thickness data corresponding to the time are extracted.

Alternatively, an elapsed time from the start of the etching processing may be obtained, and data having an elapsed time s within a predetermined range (for example, ±10 seconds) from the elapsed time and remaining film thickness data corresponding to the time may be extracted.

Alternatively, for each of the above differential waveform pattern databases 15, an elapsed time having the smallest pattern difference obtained by comparing with the actual pattern Dij of the interference light corresponding to the predetermined elapsed time and a remaining film thickness at the time may be extracted.

Next, the weighted film thickness calculator 16 calculates a value of the instantaneous film thickness value Zi at the time point i by using the interference light pattern data Q(m)sj and the remaining film thickness data r(m)s extracted for each database (step S609).

For the calculation of the instantaneous film thickness value Zi, the matrix Q in which the patterns extracted from each differential waveform pattern database 15 are combined with the data Q(m)sj, and the matrix R in which the remaining film thicknesses Ru extracted in a similar manner are combined are created.

The value of the instantaneous film thickness value Zi is calculated by substituting Q, R, and the smoothed differential value time series data Dij at the time point into the above Equations (4), (5) and (6). The wavelength range for summing and the coefficient σ in the Equations (5) and (6) use a predetermined value or a value determined by the flow shown in FIG. 7, which will be described later.

Next, the regression analyzer 18 obtains the first order regression line using the calculated instantaneous film thickness value Zi and the instantaneous film thickness Zi at the sampling time point i stored in the storage device, and calculates the calculated film thickness following the first order regression line (step S610).

Further, the current calculated film thickness of the processing target film is compared with the target remaining film thickness set in step S302, and when it is determined that the thickness is equal to or less than the target remaining film thickness, it is determined that the target is reached, and a signal for ending the etching processing is transmitted to the plasma processing apparatus 1 (step S611). When it is determined that the target is not reached, the processing returns to step S305. If it is determined that the target is reached, a setting of a sampling end is finally performed (step S612).

Next, using the flowchart of FIG. 7, a procedure for performing the recipe optimization processing performed by the etching amount measuring unit 8 in FIG. 1 corresponding to S603 in FIG. 6 will be described. A processing starts from step S701.

First, the recipe optimizer 21 determines the remaining film thickness for comparing the differential waveform patterns (reference film thickness). The film thickness may be, for example, a target remaining film thickness (step S702).

Next, in each differential waveform pattern database 15, pattern data P(m)sj of the differential waveform at the reference film thickness is extracted (step S703).

Next, the standard deviation of P(m)sj for each wavelength j is calculated by using the extracted pattern data P(m)sj (step S704).

Next, wavelengths are relatively excluded in a descending order of the standard deviation, and the remaining wavelength ranges are used as candidates for wavelength ranges to be used (step S705). Here, a plurality of candidates are created, such as a case where 10% is excluded and a case where 20% is excluded.

Next, a plurality of candidates for the coefficient σ in Equations (5) and (6) are created (step S706).

Then, a processing is performed in which one database among the differential waveform pattern databases 15 is extracted, the instantaneous film thickness is calculated using the Equation (4) using the remaining differential waveform pattern databases 15, and an error from the remaining film thickness data r(m)s is calculated (step S707). The processing is performed for combinations of the wavelength range and the coefficient σ so as to specify a combination having a small error.

As described above, the specified wavelength range and the coefficient σ are stored in the film thickness calculating recipe 17 (step S708).

Thereafter, the processing is ended (S709).

Figure 8:
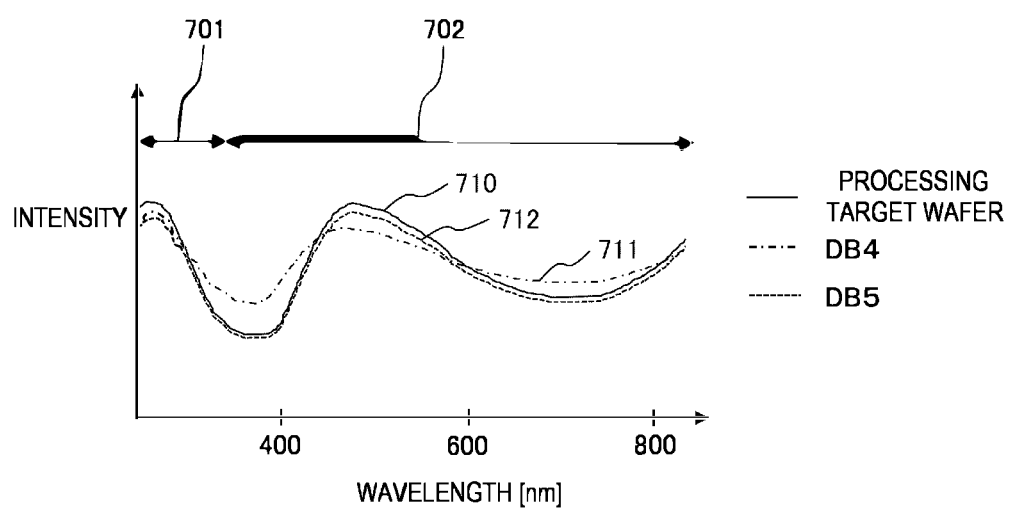
FIG. 8 is a graph showing a differential waveform pattern obtained by detecting reflected light from a wafer to be processed and a differential waveform pattern stored in the database that explains an effect of the etching process according to the embodiment of the invention, and shows that the film thickness can be detected with high accuracy by using differential waveform pattern databases measured on test semiconductor wafers with similar fine shapes by weighting the differential waveform pattern databases, even when the fine shape of the processing target material varies.

An effect of the present embodiment will be described with reference to FIG. 8. Here, the differential waveform pattern 710 obtained by detecting the reflected light from the processing target material 4 and two differential waveform pattern databases 15 are taken as examples. In the differential waveform pattern 711 of DB4 in FIG. 8, comparing with the processing target material 4, the processing target film area 213 of the test semiconductor wafer (test processing target material) in which the differential waveform pattern database 15 is measured is smaller, and the mask film thickness 211 is thicker. In the differential waveform pattern 712 of DB5, comparing with the processing target material 4, the processing target film area 213 of the test semiconductor wafer in which the differential waveform pattern database 15 is measured is of the same degree, and the mask film thickness 211 is of the same degree.

In the wavelength range 702 in FIG. 8, a time change of the interference light of the processing target film 202 is mainly measured. In the wavelength range 701, not the time change of the interference light of the processing target film 202 but a sum of the time change of the interference light of the mask 201 thinner than the processing target film with the time change of the interference light of the processing target film is measured.

Here, a case is considered in which the differential waveform pattern 711 of the DB4 and the differential waveform pattern 710 of the processing target material 4 are compared, and a film thickness when a difference between the two is small is used in the instantaneous film thickness calculation. First, in DB4, since the processing target film area 213 of the processing target material 4 is small, the time change of the interference light of the processing target film 202 to be measured is small, and an amplitude of the differential waveform pattern in the wavelength range 702 is smaller than that of the processing target material 4. Therefore, when the differential waveform pattern 711 of the DB4 is used, the differential waveform pattern indicating the interference light of the processing target film 202 does not match, and a calculation accuracy of the difference in the differential waveform pattern is reduced.

This also means that the differential waveform pattern having a small difference in the time change (wavelength range 701) of the interference light of the mask film thickness 211 is selected, and thus the differential waveform pattern 711 in a case where the mask film thickness 211 is close to the thickness, that is, in the state where the etching is more advanced in DB4 (when the processing target film 202 is thin) is selected, which generates an error in the instantaneous film thickness calculation.

In such manner, it can be seen that if a differential waveform pattern database 15 of a test semiconductor wafer having a different fine shape on the processing target material 4 is used, a calculation accuracy of the remaining film thickness is lowered. On the other hand, in a processing target material 4 having a similar fine shape, the difference in the differential waveform pattern becomes small as in the differential waveform pattern 712 in DB5.

Therefore, by weighting the differential waveform pattern database 15 using the difference in the differential waveform pattern, the film thickness can be detected with high accuracy by using differential waveform pattern databases 15 measured on test semiconductor wafers with similar fine shapes in each processing target material 4, even when the fine shape of the processing target material 4 varies.

According to the present embodiment, highly accurate film thickness estimation and end point determination under various structural variations between wafers, lots, and the like can be achieved, and a yield of device manufacturing can be improved.

While the invention made by the inventor has been described in detail based on the embodiments, the invention is not limited to the above-described embodiments, and various modifications can be made without departing from the scope of the invention. For example, the above-described embodiments have been described in detail for easy understanding of the invention, and the invention is not necessarily limited to those including all the configurations described above. Further, a part of the configuration of each embodiment may be added, deleted, or replaced with another configuration.

What is claimed is:

1. A plasma processing method for processing a film to be processed contained in a plurality of film layers formed on a surface of a wafer arranged inside a processing chamber with a plasma generated in the processing chamber, the method comprising:
    detecting time-series data related to a light from inside of the processing chamber by detecting light from the inside of the processing chamber at a plurality of times during the processing of the wafer;
    calculating a thickness of the film to be processed by comparing an actual pattern data indicating intensities or differential coefficients in a plurality of wavelengths of the light obtained from the time-series data using the plurality of wavelengths of the light as a parameter and a pattern data for detection obtained in advance by using multiple pattern data, each of which a remaining film thickness of the film to be processed during the processing and the pattern data relating to the light using the plurality of wavelengths of the light as the parameter are associated with each other, the multiple pattern data having variations in values with the plurality of the wavelengths of the light and the pattern data for detection obtained by using the multiple pattern data excluding the data in each of the plurality of wavelengths having a larger deviation value than a predetermined reference value among the multiple pattern data; and
    determining an end point of the processing of the wafer using the plasma based on the value of the calculated film thickness.

2. The plasma processing method according to claim 1, wherein
    in the step of calculating, the thickness of the film to be processed is calculated by comparing the actual pattern data and the pattern data for detection by using a sum of the multiple pattern data.

3. The plasma processing method according to claim 1, wherein
    in the step of calculating, the thickness of the film to be processed is calculated by comparing the actual pattern data and a pattern data for detection by using a sum of the multiple pattern data each of which are multiplied by a weighting coefficient determined according to a magnitude of a difference from the actual pattern data.

4. The plasma processing method according to claim 1, wherein
    the plurality of pattern data have different patterns depending on the thickness or structure of the film contained in the plurality of film layers.

5. The plasma processing method according to claim 4, wherein
    in the step of calculating, the thickness of the film to be processed is calculated by comparing the actual pattern data and the pattern data for detection by using a sum of the multiple pattern data.

6. The plasma processing method according to claim 4, wherein
    in the step of calculating, the thickness of the film to be processed is calculated by comparing the actual pattern data and a pattern data for detection by using a sum of the multiple pattern data each of which are multiplied by a weighting coefficient determined according to a magnitude of a difference from the actual pattern data.

7. A plasma processing method for processing a film to be processed contained in a plurality of film layers formed on a surface of a wafer arranged inside a plasma processing chamber with plasma generated in the processing chamber, the method comprising:
    detecting time-series data related to a light from inside of the processing chamber by detecting light from the inside of the processing chamber at a plurality of times during the processing of the wafer;
    calculating a thickness of the film to be processed by comparing an actual pattern data indicating intensities or differential coefficients in a plurality of wavelengths of the light obtained from the time-series data using the plurality of wavelengths of the light as a parameter and a pattern data for detection obtained in advance by using multiple pattern data, each of which a remaining film thickness of the film to be processed during the processing and the pattern data relating to the light using the plurality of wavelengths of the light as the parameter are associated with each other, the multiple pattern data having variations in values with the plurality of the wavelengths of the light and the pattern data for detection obtained by using the multiple pattern data excluding the data in each of the plurality of wavelengths having a deviation value in a predetermined top percentage among the multiple pattern data, and determining an end point of the processing of the wafer using the plasma based on the value of the calculated film thickness.

8. The plasma processing method according to claim 7, wherein the step of calculating the thickness of the film to be processed is calculated by comparing the actual pattern data and the pattern data for detection by using a sum of the multiple pattern data.

9. The plasma processing method according to claim 7, wherein the step of calculating the thickness of the film to be processed is calculated by comparing the actual pattern data and the pattern data for detection by using a sum of the multiple pattern data multiplied by a weighting coefficient determined according to a magnitude of a difference from the actual pattern data.

10. The plasma processing method according to claim 7, wherein the plurality of pattern data each have different patterns depending on the thickness or structure of the film contained in the plurality of film layers.

11. The plasma processing method according to claim 10, wherein the step of calculating the thickness of the film to be processed is calculated by comparing the actual pattern data and the pattern data for detection by using a sum of the multiple pattern data.

12. The plasma processing method according to claim 10, wherein the step of calculating the thickness of the film to be processed is calculated by comparing the actual pattern data and the pattern data for detection by using a sum of the multiple pattern data multiplied by a weighting coefficient determined according to a magnitude of a difference from the actual pattern data.

* * * * *